United States Patent
Kim et al.

(10) Patent No.: US 7,979,760 B2
(45) Date of Patent: Jul. 12, 2011

(54) TEST SYSTEM FOR CONDUCTING PARALLEL BIT TEST

(75) Inventors: Byoung-sul Kim, Suwon-si (KR); Seung-hee Lee, Seoul (KR); Jung-kuk Lee, Yongin-si (KR); Hee-joo Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 187 days.

(21) Appl. No.: 12/382,026

(22) Filed: Mar. 6, 2009

(65) Prior Publication Data

US 2009/0228747 A1    Sep. 10, 2009

(30) Foreign Application Priority Data

Mar. 7, 2008    (KR) .................. 10-2008-0021566

(51) Int. Cl.
*G11C 29/00* (2006.01)
(52) U.S. Cl. ......................................... 714/718; 714/42
(58) Field of Classification Search .................. 324/755, 324/765; 714/42, 708, 719, 704, 718
See application file for complete search history.

(56) References Cited

U.S. PATENT DOCUMENTS

| | | | | |
|---|---|---|---|---|
| 6,415,397 | B1 * | 7/2002 | Co et al. | 714/42 |
| 6,593,763 | B2 * | 7/2003 | Weber | 324/755 |
| 6,762,615 | B2 * | 7/2004 | Lee et al. | 324/765 |
| 2008/0065933 | A1 * | 3/2008 | Thayer | 714/42 |

FOREIGN PATENT DOCUMENTS

| | | |
|---|---|---|
| JP | 2005-078603 | 3/2005 |
| KR | 10-2001-0112540 | 12/2001 |
| KR | 20-0287948 | 8/2002 |

* cited by examiner

*Primary Examiner* — David Ton
(74) *Attorney, Agent, or Firm* — Harness, Dickey & Pierce, P.L.C.

(57) ABSTRACT

Provided is a test system conducting a parallel bit test. The test system, conducting a parallel bit test on a plurality of memory modules mounted on a socket, comprises a plurality of counters and a comparator. Each of the counters counts the number of data output signals in the same logic state, among the data output signals outputted from each memory of the memory modules, and outputs a count signal. The comparator compares the count signal outputted from each of the counters and outputs a comparison signal corresponding to a defect of the memory modules. According to the test system, defects in a memory module can be accurately detected and a possibility of an error in the detection can be reduced when a plurality of memory modules are tested, as compared to conventional test systems.

15 Claims, 5 Drawing Sheets

TEST SYSTEM FOR CONDUCTING PARALLEL BIT TEST

FOREIGN PRIORITY STATEMENT

This application claims priority under 35 U.S.C. §119 to Korean Patent Application No. 10-2008-0021566, filed on Mar. 7, 2008, in the Korean Intellectual Property Office (KIPO), the entire contents of which are incorporated herein in by reference.

BACKGROUND

1. Field of the Invention

The present invention relates to a memory module test, and more particularly, a test system for conducting parallel bit tests on a plurality of memory modules.

2. Description of the Related Art

A manufacturing process of semiconductor memory devices such as dynamic random access memory (DRAM) includes circuit design, various fabrication processes, and various test steps. The various test steps may include a wafer test, a package test and a module test and the like. Generally, a parallel bit test has been used to reduce test time in each test step. A parallel bit test is a test method that can find a memory having defects by writing the same data into a plurality of memory cells, then reading the written data from the plurality of memory cells, and comparing the read data and written data or comparing the read data of each of the plurality of memory cells to each other. This invention relates to the module test after a plurality memory devices are mounted on the memory module.

When a plurality of memory modules are tested using a parallel bit test method, a socket capable of being loaded with the plurality memory modules has been used to detect defects in the plurality of memory modules. That is, the defects in the plurality of memory modules are detected by writing the same data into the plurality of memory modules mounted on a single socket, reading the written data from the plurality of memory modules, and comparing the written data with the read data.

FIG. 1 is a waveform diagram of data signals outputted from each of a first and a second memory module, and of a merged output data signal in a conventional test system.

In the example illustrated in FIG. 1, it is assumed that the first memory module and the second memory module are mounted on a single socket. A merged output data signal MDOUT indicates a waveform after the output data from the first memory module and the output data from the second memory module are merged. Referring to FIG. 1, the conventional test system detects that the first and second memory modules operate normally when both of the first and second memory modules output data in a logic high state and merged output data signal MDOUT becomes a logic high state as shown in FIG. 1A. In addition, the conventional test system detects that the first and second memory modules operate normally when both of the first and second memory modules output data in a logic low state and merged output data signal MDOUT becomes a logic low state as shown in FIG. 1B.

However, the possibility of detecting defects of the memory modules is decreased when each of the memory modules outputs data in different states as shown in FIGS. 1C and 1D because the MDOUT has unstable state. For example, if the first memory module outputs data in a logic low state and the second memory module outputs data in a logic high state or the first memory module outputs data in a logic high state and the second memory module outputs data in a logic low state, the data outputted from each of the memory modules are merged to have an intermediate voltage level between the logic high and logic low values, and thus, making it difficult to detect defects in the memory modules.

SUMMARY

The present invention provides a test system which can reduce the possibility of an error in detecting defects in a plurality of memory modules when a parallel bit test is conducted on the plurality of memory modules.

According to an example embodiment, a test system for conducting a parallel bit test on a plurality of memory modules mounted on a socket, may comprise a plurality of counters, each of the plurality of counters being associated with at least one memory unit in the plurality of memory modules, each of the plurality of counters being configured to generate a count signal based on a number of data bits having a reference logic state among data output signals output from the associated memory unit; and a determining device configured to output a comparison signal based on the count signals output from the plurality of counters, the comparison signal indicating whether at least one of the memory modules have a defect.

Each of the counters may be configured so that a logic state of the output count signal is chosen based on whether the number of the data bits having the reference logic state is even or odd.

The test system may further comprise a controller configured to selectively disable outputting the data output signals based on the comparison signal.

The controller may be connected to a DQS pad of the memory module and may be configured to apply a disable voltage to the DQS pad based on the comparison signal.

The determining unit may be a comparator, and the comparison signal may be a comparison signal. The comparator may be configured to generate the comparison signal having a first logic state if the count signals output by each of the plurality of counters have different logic states, and configured to generate the comparison signal having a second logic state if the count signals output by each of the plurality of counters have equal logic states.

The controller may be configured to selectively apply the disable voltage to the DQS pad if the comparison signal is in the first logic state.

The determining device may be an XOR gate configured to receive the count signals outputted from each of the counters, and perform an XOR operation, and the comparison signal may be an output of the XOR operation.

The controller may be a transistor including a gate, a first terminal connected to the pad, and a second terminal, and the transistor may be configured so that the comparison signal is applied to the gate, the DQS signal is applied to the first terminal, and the disable voltage is applied to the second terminal, the disable voltage being a ground voltage.

The test system may further comprise a test signal generator configured to generate a test signal, the parallel bit test being conducted based on the test signal.

Each of the plurality of counters may be enabled or disabled in based on the test signal.

The test system may be configured so that the parallel bit test is conducted if the memory modules each perform a refresh operation.

The test system of claim may further comprise an AND gate configured to conduct an AND operation on a refresh signal and the comparison signal, the refresh signal being enabled if each of the plurality of memory modules conduct a refresh operation.

Each of the plurality counters may be configured to output the count signal via an unused pin of the memory module or the memory.

At least one of the plurality counters may be associated with at least two memory units in the plurality of memory modules.

According to another example embodiment, a test system for conducting a parallel bit test on a plurality of memory modules may comprise a socket on which the plurality of memory modules are mounted; and an error signal generator configured to detect whether the memory modules have a defect by comparing output signals from each of the memory modules, bit by bit, and configured to output an error signal.

The error signal generator may be an XOR gate configured to receive the output signals, perform an XOR operation based on the output signals, and output the error signal based on the XOR operation.

The test system may further comprise a central processing unit (CPU) configured to receive the error signal via an input/output line.

The test system may further comprise a south bridge configured to transfer the error signal to the CPU.

The CPU may be configured to determine whether to generate a basic input-output system (BIOS) routine call in response to the error signal.

According to yet another example embodiment, a test system for conducting a parallel bit test on a plurality of memory modules mounted on a socket may comprise a first counter associated with at least one memory unit of a first memory module, the first counter being configured to generate a first count signal based on a number of data bits having a reference logic state among output data signals from the associated memory unit, the first counter being configured to output the first count signal in response to a test enable signal; a second counter associated with at least one memory unit of a second memory module, the second counter being configured to generate a first count signal based on a number of data bits having a reference logic state among output data signals from the associated memory unit, the second counter being configured to output the second count signal in response to the test enable signal; a determination device configured to output a comparison signal based on the first and the second count signals; and a controller configured to selectively disable outputting the output data signals from the first and the second memory modules based on the comparison signal.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1A:
FIG. 1 is a waveform diagram of signals outputted from each of a first and second memory module in a conventional test system.
Figure 1B:
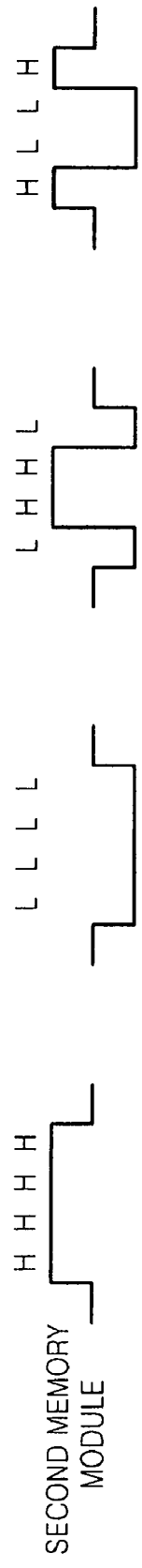
Figure 1C:
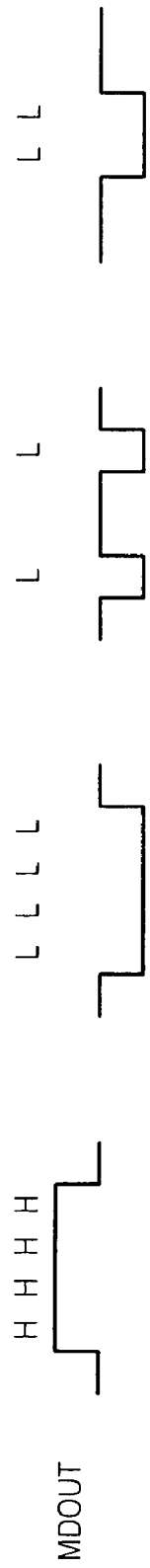
Figure 1D:

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
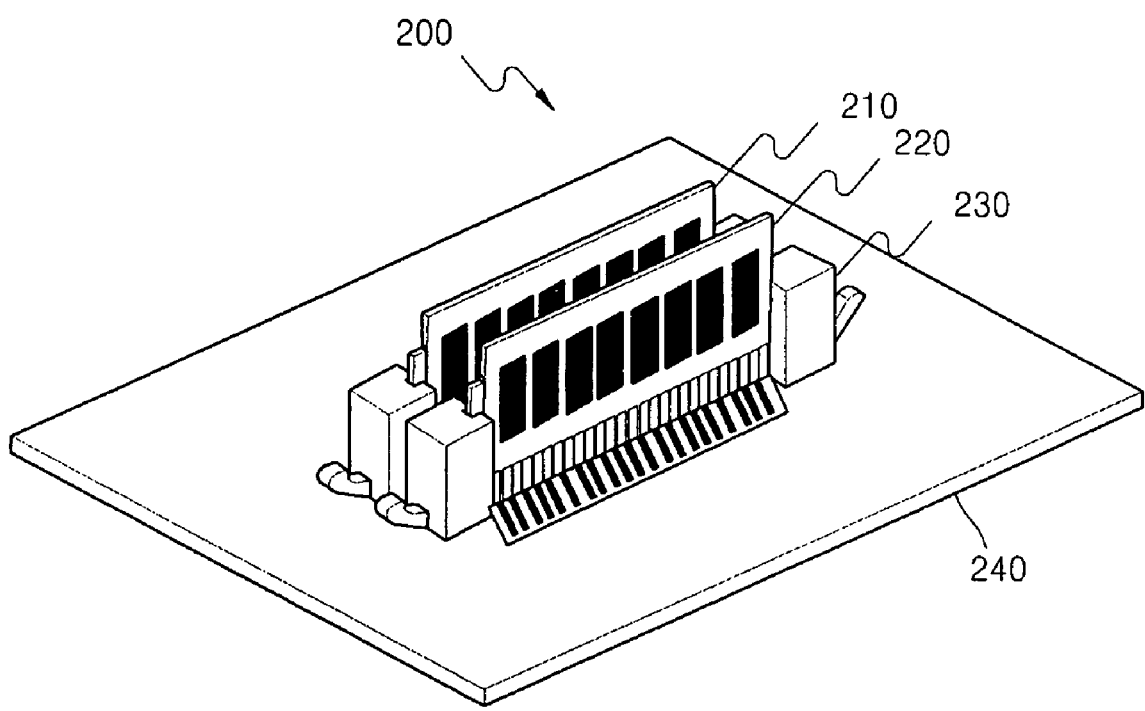
FIG. 2 shows a configuration of a test system according to an embodiment of the present invention.

FIG. 2 shows a configuration of a test system 200 according to one example embodiment.

Figure 3A:
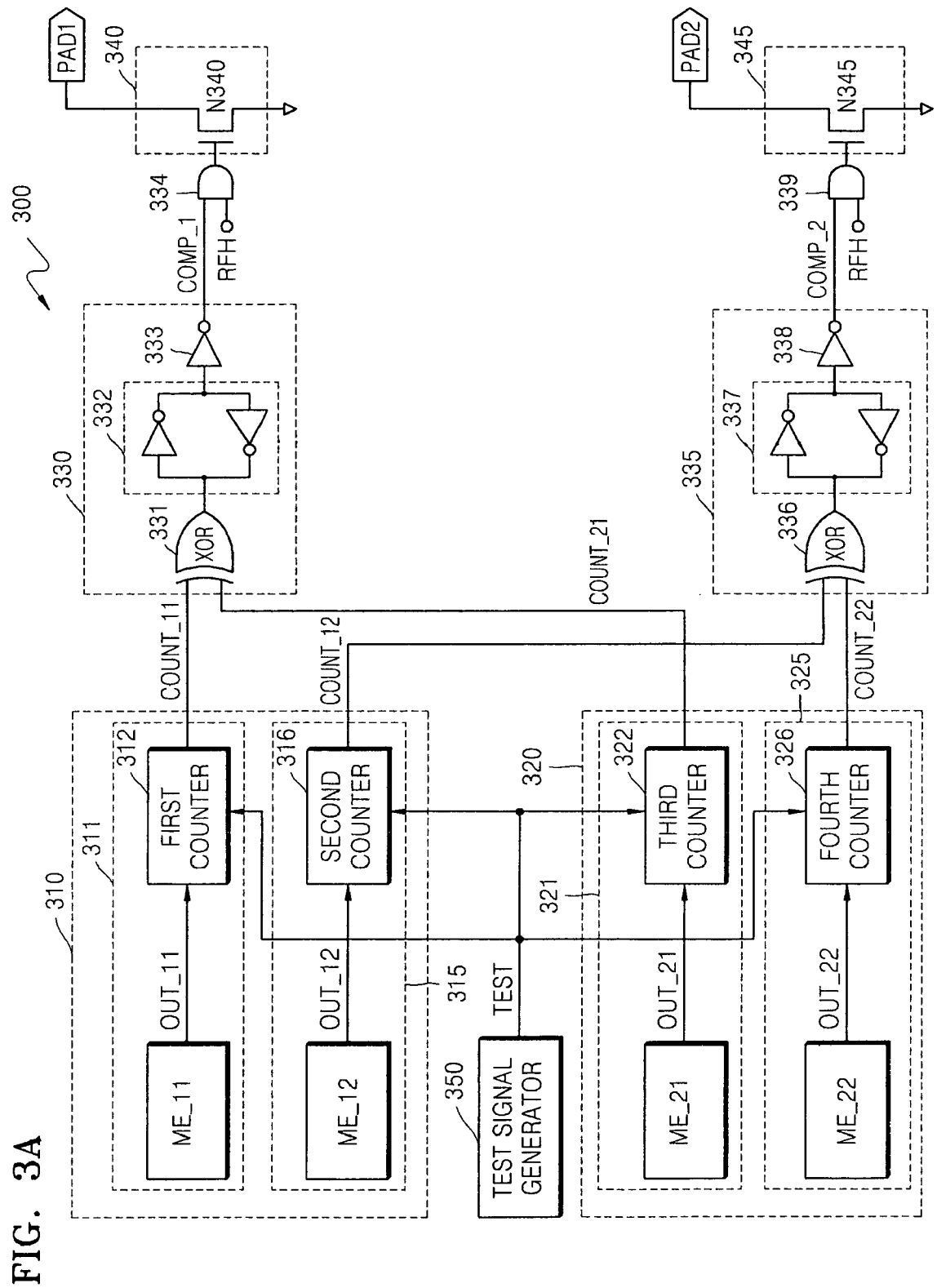
FIG. 3A is a block diagram of a test system according to an embodiment of the present invention.

Referring to FIG. 2, the test system 200 includes a socket 230, a board 240 and a plurality of memory modules 210 and 220. In the embodiment illustrated in FIG. 2, two memory modules mounted on a single socket. Though in the present embodiment two memory modules are mounted on a single socket, any number of memory modules may be mounted on a singe socket and the same effects of the present embodiment may be obtained. Additionally, though board 240 is illustrated as having only one socket 230, board 240 may have more than one socket. FIG. 3A is a block diagram of a test system 300 according to an example embodiment.

Referring to FIG. 3A, the test system 300 includes a first memory module 310, a second memory module 320, first and second comparators 330 and 335, and first and second controllers 340 and 345. Each of the first memory module 310 and the second memory module 320 may include a plurality of memory devices. According to FIG. 3A, the first memory module 310 includes a first memory device 311 and a second memory device 315, and the second memory module 320 includes a third memory device 321 and a fourth memory device 325. Though first and second memory modules 310 and 320 are illustrated as each including two memory devices, first and second memory modules 310 and 320 may include any number of memory devices and the same effects of the present embodiment may be obtained. Furthermore, the number of the comparators and the controllers may vary according to the number of memory devices. The first memory device 311 includes a first memory block ME_11 and a first counter 312. The second memory device 315 includes a second memory block ME_12 and a second counter 316. The third memory device 321 includes a third memory block ME_21 and a third counter 322. The fourth memory device 325 includes a fourth memory block ME_22 and a fourth counter 326. In addition, the test system 300 may further include a test mode signal generator 350 that generates a test enable signal TEST.

Although the socket 230 shown in FIG. 2 is not shown in FIG. 3, the first memory module 310 and the second memory module 320 are mounted on the socket 230 as described for FIG. 2. Hereinafter, a parallel bit test will be described as being conducted on two memory modules, the first and second memory modules 310 and 320, mounted on a single socket. However, the parallel bit test may be conducted with any number of memory modules mounted on a socket and the same effects of the present invention may be obtained.

When a parallel bit test is conducted on the first memory device 311 of the first memory module 310 and the third memory device 321 of the second memory module 320 at the same time, the test system 300 writes same data to the first memory block ME_11 of the first memory module 310 and the third memory block ME_21 of the second memory module 320, and reads the written data from the first memory block ME_11 of the first memory module 310 and the third memory block ME_21 of the second memory module 320. Here, the first counter 312 counts the number of data bits having a reference logic state, for example a high logic state, among the data output signals OUT_11 outputted from the first memory block ME_11 of the first memory module 310 during the read operation of the parallel bit test, and outputs a first count signal COUNT_11. In addition, the third counter 322 counts the number of data bits having a reference logic state, for example a high logic state, among the data output signals OUT_21 outputted from the third memory block ME_21 of the second memory module 320 during the read operation of the parallel bit test, and outputs a third count signal COUNT_21. The first counter 312 and the third counter 322 output the first count signal COUNT_11 and the third count signal COUNT_21, respectively. The logic states of each of the first count signal COUNT_11 and the third cont signal COUNT_21 may vary based on whether the number of output signals having a reference logic state is even or odd.

The first comparator 330 outputs a first comparison signal COMP_1 indicating whether the memory modules have a defect or not, by comparing the first count signal COUNT_11 outputted from the first counter 312 with the third count signal COUNT_21 outputted from the third counter 322. That is, if the logic states of the first count signal COUNT_11 and the third count signal COUNT_21 are different, the first comparator 330 outputs a first comparison signal COMP_1 in a first logic state, which indicates an error exits. Otherwise, if the logic states of the first count signal COUNT_11 and the third count signal COUNT_21 are the same, the first comparator 330 outputs a first comparison signal COMP_1 in the second logic state, which indicates no error exists. Hereinafter, the first logic state is a logic high state, and the second logic state is a logic low state. Alternatively, the first logic state may be a logic low state, and the second logic state may be a logic high state and the same effects of the present invention may be obtained.

The first comparator 330 may include an XOR gate 331, a latch circuit 332 and an inverter 333. The XOR gate 331 receives the first count signal COUNT_11 and the third count signal COUNT_21 and outputs the result of the XOR operation. That is, the XOR gate 331 outputs the signal in logic high state when the logic states of the first count signal COUNT_11 and the third count signal COUNT_21 are different, and the signal in logic low state when the logic states of the first count signal COUNT_11 and the third count signal COUNT_21 are the same. The latch circuit 332 and the inverter 333 latch the signal outputted from the XOR gate 331 and output the first comparison signal COMP_1 to the first controller 340.

The first controller 340 may supply a disable voltage VSS to a PAD1 on the memory module in response to the first comparison signal COMP_1. The PAD1 may be a data strobe (DQS) pad. The first controller 340 selectively disables outputting of the data output signals from the memory module or the memory device having defects in response to the first comparison signal COMP_1. For example, if the first memory module 310 is a reference module and the second memory module 320 is tested, the controller 340 detects that the second memory module 320 has defects when the first comparison signal COMP_1 is in the first logic state and controls the second memory module 320 or the third memory device 321 not to output data after detecting defects. The controller 340 detects that the second memory module 320 does not have defects when the first comparison signal COMP_1 is in the second logic state and controls the second memory module 320 or the third memory device 321 to output data continuously. In order to selectively apply the disable voltage to the DQS pad PAD1 when any defect is detected in response to the first comparison signal COMP_1, the first controller 340 may include a NMOS transistor N340. The disable voltage VSS is connected to the source of the NMOS transistor N340 and the DQS pad PAD1 is connected to the drain of the NMOS transistor N340. The disable voltage VSS may be a ground voltage. That is, when the first comparison signal COMP_1 is in the first logic state, the NMOS transistor N340 is turned on and applies the disable voltage VSS to the DQS pad PAD1 to disable outputting the data output signals from the memory module or the memory device. However, when the first comparison signal COMP_1 is in the second logic state, the NMOS transistor N340 is turned off and the DQS signal is outputted through the DQS pad PAD1.

Hereinafter, a method of testing the second memory device 315 of the first memory module 310 and the fourth memory device 325 of the second memory module 320 will be described. The test system 300 writes the same data to the second memory block ME_12 of the first memory module 310 and the fourth memory block ME_22 of the second memory module 320, and reads the written data from the second memory block ME_12 of the first memory module 310 and the fourth memory block ME_22 of the second memory module 320. The second counter 316 counts the number of data bits having a reference logic state, for example a high logic state, among the data output signals OUT_12 outputted from the second memory block ME_12 of the first memory module 310 during the read operation of the parallel bit test, and outputs a second count signal COUNT_12. In addition, the fourth counter 326 counts the number of data bits having a reference logic state, for example a high logic state, among the data output signals OUT_22 outputted from the fourth memory block ME_22 of the second memory module 320 during the read operation of the parallel bit test, and outputs a fourth count signal COUNT_22. The second counter 316 and the fourth counter 326 output the second count signal COUNT_12 and the fourth count signal COUNT_22, respectively. The logic states of each of the second count signal COUNT_12 and the fourth count signal COUNT_22 may vary based on whether the number of output signals having the reference logic state is even or odd.

The second comparator 335 outputs a second comparison signal COMP_2 indicating whether the memory modules have a defect or not by comparing the second count signal COUNT_12 outputted from the second counter 316 with the fourth count signal COUNT_22 outputted from the fourth counter 326. That is, if the logic states of the second count signal COUNT_12 and the fourth count signal COUNT_22 are different, the second comparator 360 outputs a second comparison signal COMP_2 in a first logic state, which indicates an error exists. Otherwise, if the logic states of the second count signal COUNT_12 and the fourth count signal COUNT_22 are the same, the second comparator 330 outputs a second comparison signal COMP_2 in the second logic state, which indicates an error does not exist.

The second comparator 335 may include an XOR gate 336, a latch circuit 337 and an inverter 338. The XOR gate 336 receives the second count signal COUNT_12 and the fourth count signal COUNT_22 and outputs the result of the XOR operation. The latch circuit 337 and the inverter 338 latches the signal outputted from the XOR gate 336 and outputs the second comparison signal COMP_2 to the second controller 345.

The second controller 345 may supply a disable voltage VSS to a PAD2 on the memory module in response to the first comparison signal COMP_2. The PAD2 may be DQS pad. The second controller 345 selectively disables outputting of the data output signals from the memory module or the memory device having defects in response to the second comparison signal COMP_2. For example, the second controller 345 may enable or disable outputting the data output signals from the memory module by selectively applying a disable voltage to a DQS pad PAD2 of the memory module or the memory device in response to the second comparison signal COMP_2. In order to selectively apply the disable voltage to the DQS pad PAD2 when any defect is detected in response to the second comparison signal COMP_2, the second controller 345 may include a NMOS transistor N345. The disable voltage VSS is connected to source of the NMOS transistor N345 and the DQS pad PAD2 is connected to drain of the NMOS transistor N345. The disable voltage VSS may be a ground voltage. If the DQS pads PAD1 and PAD2 are each DQS pads corresponding memory devices, a controller may be separately installed as shown in FIG. 3A. However, if the DQS pads PAD1 and PAD2 are a DQS pad of a memory module, a single controller may be installed. For example, if the DQS pads PAD1 and PAD2 are a DQS pad of the memory module, the single controller may be an NMOS transistor, the gate of which may be applied to OR operation signal between the first comparison signal COMP_1 and the second comparison signal COMP_2.

In the above-described memory test system, each of the comparators 330 and 335 includes an XOR gate, a latch circuit and an inverter, and each of the controllers 340 and 345 includes an NMOS transistor. However, each of the comparators 330 and 335 may use any logical component that can operate as a comparator, and each of controllers 340 and 345 may use any logical component that can operate as a controller. For example, if the first comparator 330 includes an XNOR gate, a latch circuit and an inverter and the first controller 340 includes a PMOS transistor, the same effects of the present invention may be obtained.

The test signal generator 350 generates a test signal TEST and outputs the test signal TEST to the first counter 312, the second counter 316, the third counter 322 and the fourth counter 326, each of which use the test signal TEST to determine whether to conduct the parallel bit test. That is, the first counter 312, the second counter 316, the third counter 322 and the fourth counter 326 conduct counting operations as described above when the test signal TEST is enabled.

The test system 300 may be designed to conduct the parallel bit test when the first memory module 310 and the second memory module 320 conduct refresh operations. For example, the test system 300 may further include an AND gate 333 that conducts an AND operation on a refresh signal RFH and the first comparison signal COMP_1, and an AND gate 339 that conducts an AND operation on a refresh signal RFH and the second comparison signal COMP_2. The refresh signal RFH is enabled when the first memory module 310 or the second memory module 320 conduct refresh operations. The AND gate may output the result of the AND operation to the first controller 340 or the second controller 345.

Hereinafter, an operation of the test system 300 is described. If the first memory module 310 is a reference module and the second memory module 320 is tested, the first counter 312 and the third counter 322 count the number of data bits in a logic high state among a predetermined or reference number of bits of output signals OUT_11 and OUT_21, respectively. In addition, it is regarded that the first and third count signals COUNT_11 and COUNT_21 are in the first logic state when the number of data having the same logic state is even, and the first and third count signals COUNT_11 and COUNT_21 are in the second logic state when the number of data having the same logic state is odd. An operation of the test system 300 will be further described with reference to four example cases.

First, when the number of data bits in a logic high state among output signals OUT_11, as counted by the first counter 312, is even, and the number of data bits in a logic high state among output signals OUT_21, as counted by the third counter 322, is even, the first comparator 330 outputs the first comparison signal COMP_1 in the second logic state since the first count signal COUNT_11 and the third count signal COUNT_21 are both in the first logic state. Since the first comparison signal COMP_1 in the second logic state is applied to the gate of the NMOS transistor N340, the NMOS transistor N340 is turned off and the DQS signal is outputted through the DQS pad PAD1.

Second, when the number of data bits in a logic high state among output signals OUT_11, as counted by the first counter 312, is odd, and the number of data bits in a logic high state among output signals OUT_21, as counted by the third counter 322, is odd, the first comparator 330 outputs the first comparison signal COMP_1 in the second logic state since the first count signal COUNT_11 and the third count signal COUNT_21 are both in the second logic state. Thus, since the first comparison signal COMP_1 in the second logic state is applied to the gate of the NMOS transistor N340, the NMOS transistor N340 is also turned off and the DQS signal is outputted through the DQS pad PAD1.

Third, when the number of data bits in a logic high state among output signals OUT_11, as counted by the first counter 312, is even, and the number of data bits in a logic high state among output signals OUT_21, as counted by the third counter 322, is odd, the first comparator 330 outputs the first comparison signal COMP_1 in the first logic state since the first count signal COUNT_11 is in the first logic state and the third count signal COUNT_21 is in the second logic state. Therefore, since the first comparison signal COMP_1 in the first logic state is applied to the gate of the NMOS transistor N340, the NMOS transistor N340 is turned on and the disable voltage VSS is applied to the DQS pad PAD1.

Fourth, when the number of data in logic high state among output signals OUT_11, as counted by the first counter 312, is odd, and the number of data in logic high state among output signals OUT_21, as counted by the third counter 322, is even, the first comparator 330 outputs the first comparison signal COMP_1 in the first logic state since the first count signal COUNT_11 is in the second logic state and the third count signal COUNT_21 is in the first logic state. Therefore, since the first comparison signal COMP_1 in the first logic state is applied to the gate of the NMOS transistor N340, the NMOS transistor N340 is also turned on and the disable voltage VSS is applied to the DQS pad PAD1.

That is, according to the first and second cases, since the test system 300 detects that the second memory module 320 does not have defects, the DQS signal is outputted through the DQS pad PAD1 in order to normally operate the second memory module 320. However, according to the third and fourth cases, since the test system 300 detects that the second memory module 320 has defects, the DQS signal is disabled from being outputted through the DQS pad PAD1 in order to disable outputting data from the second memory module 320.

The first count signal COUNT_11 may be output through an unused pin of the first memory device 311 or the first memory module 310 during parallel bit test, like DM (data mask) pin. The second count signal COUNT_21 may be output through an unused pin of the second memory device 315 or the second memory module 320 during parallel bit test, like DM (data mask) pin. The first comparator 330, the second comparator 335, the first controller 340 and the second controller 345 may be mounted on the socket 230. There has been described a plurality memory modules, each of which includes a plurality of memory devices, wherein each of the memory devices includes a plurality of memory blocks and a plurality of counters.

Figure 3B:
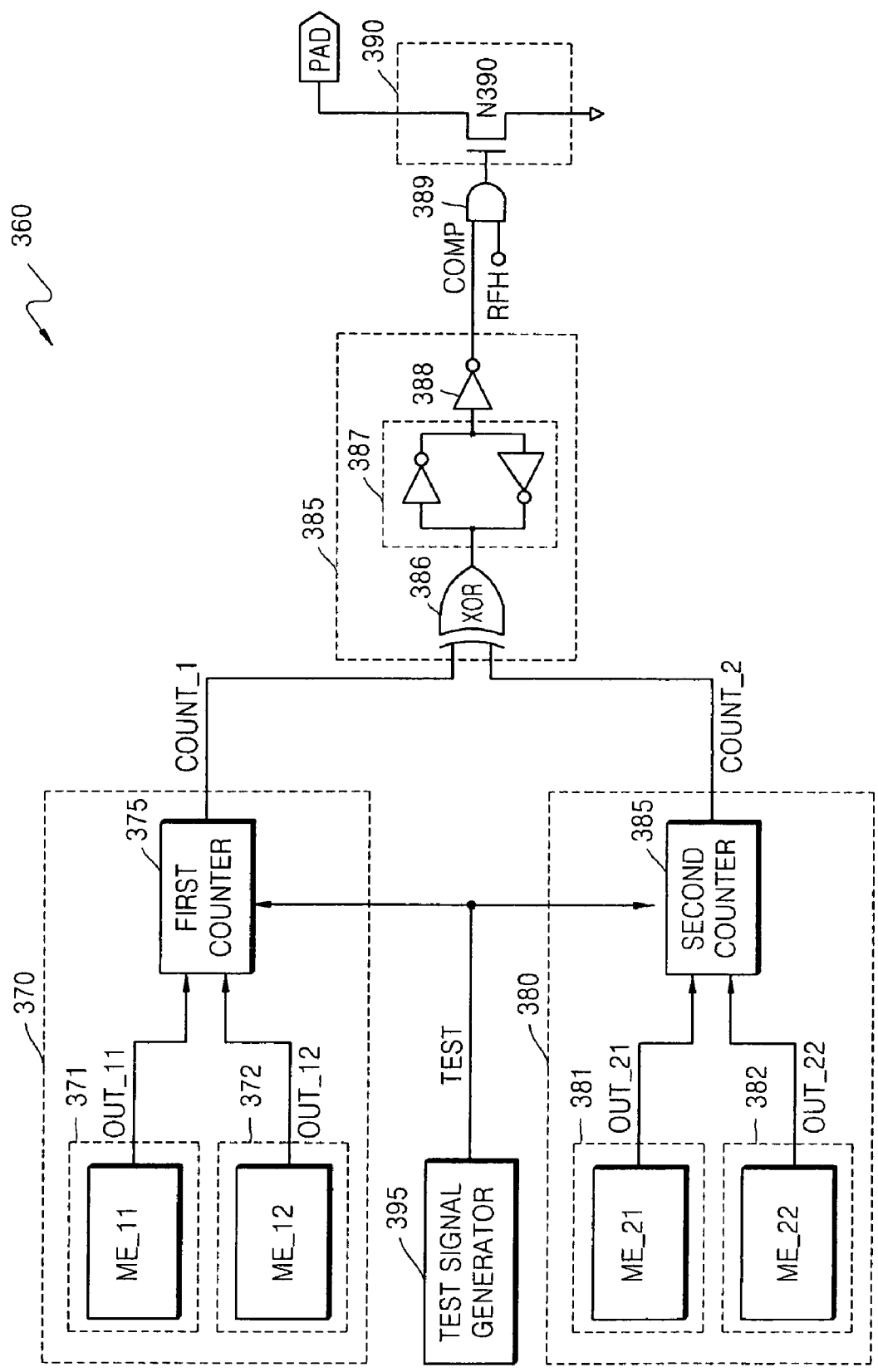
FIG. 3B is a block diagram of a test system according to an another embodiment of the present invention.

FIG. 3B is a block diagram of a test system 360 in accordance with another example embodiment.

Referring to FIG. 3B, the test system 360 includes a first memory module 370, a second memory module 380, comparator 385, and a controller 390. Each of the memory modules 370 and 380 includes a plurality of memory devices. According to FIG. 3B, the first memory module 370 includes a first memory device 371 and a second memory device 372, and the second memory module 380 includes a third memory device 381 and a fourth memory device 382. Though first and second memory modules 370 and 380 are illustrated as each including two memory devices, first and second memory modules 370 and 380 may include any number of memory devices and the same effects of the present embodiment may be obtained. The first memory device 371 includes a first memory block ME_11 and the second memory device 372 includes a second memory block ME_12. The third memory device 381 includes a third memory block ME_21 and the fourth memory device 325 includes a fourth memory block ME_22. The test system 360 illustrated in FIG. 3B is different from the test system 300 illustrated in FIG. 3A in that in test system 360, each of the memory modules includes a counter instead of each of the memory devices. In addition, the test system 360 may further include a test mode signal generator 395. The memory devices on each of the memory modules 370 and 380 may share the same counter.

The test system 360 writes the same data to the first memory block ME_11 of the first memory module 370 and the third memory block ME_21 of the second memory module 380, and reads the written data from the first memory block ME_11 of the first memory module 370 and the third memory block ME_21 of the second memory module 380. The first counter 375 counts the number of data bits having a reference logic state, for example a high logic state, among the data output signals OUT_11 outputted from the first memory block ME_11 of the first memory module 370 during the read operation of the parallel bit test, and outputs a first count signal COUNT_1. In addition, the second counter 385 counts the number of data having a reference logic state, for example a high logic state, among the data output signals OUT_21 outputted from the third memory block ME_21 of the second memory module 380 during the read operation of the parallel bit test, and outputs a second count signal COUNT_2. The first counter 375 and the second counter 385 output the first counter signal COUNT_1 and the second count signal COUNT_2, respectively. The logic states of each of the second count signal COUNT_1 and the fourth count signal COUNT_2 may vary based on whether the number of output signals having the reference logic state is even or odd.

The comparator 385 outputs a comparison signal COMP indicating whether the memory modules have an error or not by comparing the first count signal COUNT_1 outputted from the first counter 375 with the second count signal COUNT_2 outputted from the second counter 385. That is, if the logic states of the first count signal COUNT_1 and the second count signal COUNT_2 are different, the comparator 385 outputs a comparison signal COMP in a first logic state, which indicates an error exists. Otherwise, if the logic states of the first count signal COUNT_1 and the second count signal COUNT_2 are the same, the comparator 385 outputs a comparison signal COMP in the second logic state, which indicates no error exists.

Comparator 385 operates in the same manner as that of first and second comparators 330 and 335 illustrated in FIG. 3A, controller 390 operates in the same manner as that of first and second controllers 340 and 345 illustrated in FIG. 3A, and inverter 388 operates in the same manner as that of inverters 333 and 338 illustrated in FIG. 3A. Accordingly, an explanation of the comparator 385 and the controller 390 will not be repeated.

The test signal generator 395 generates a test signal TEST and outputs the test signal TEST to the first counter 375 and the second counter 385, each of which use the test signal TEST to determine whether to conduct the parallel bit test. That is, the first counter 375 and the second counter 385 conduct counting operations as described above when the test signal TEST is enabled. Also, the test signal TEST of test signal generator 395 may have information indicating the order in which the memory devices in the memory module are tested. For example, the test signal TEST may indicate to the first and second counters 375 and 385 to count bits from the first memory block ME_11 and the second memory block ME_21, respectively, so that the first memory block ME_11 and the second memory block ME_21 may be tested. Alternatively, test signal TEST may indicate to the first and second counters 375 and 385 to count bits from the second memory block ME_12 and the fourth memory block ME_22, respectively, so that the second memory block ME_12 and the fourth memory block ME_22 may be tested.

The test system 360 may be designed to conduct the parallel bit test when the first memory module 370 and the second memory module 380 conduct refresh operations. For example, the test system 360 may further include an AND gate 389 that conducts an AND operation on a refresh signal RFH and the comparison signal COMP. The refresh signal RFH is enabled when the first memory module 370 or the second memory module 380 conduct refresh operations. The AND gate may output the result of the AND operation to the controller 390.

Figure 4:
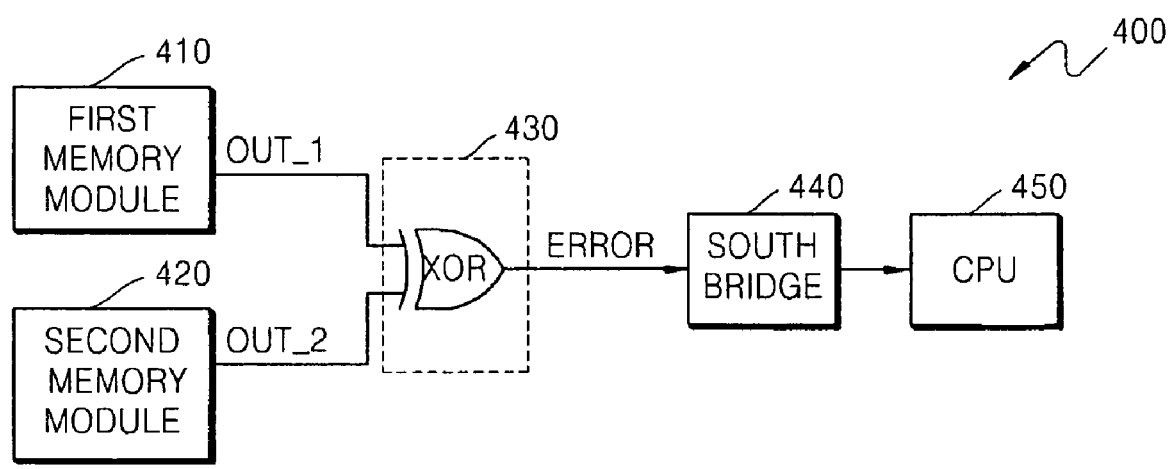
FIG. 4 is a block diagram of a test system according to another embodiment of the present invention.

FIG. 4 is a block diagram of a test system 400 in accordance with a further example embodiment.

Referring to FIG. 4, the test system 400 may include a first memory module 410, a second memory module 420 and an error signal generator 430. Furthermore, the test system 400 may further include a south bridge 440 and a central processing unit (CPU) 450.

In the example illustrated in FIG. 4, a test system conducting a parallel bit test on two memory modules mounted on the socket like 230 of FIG. 2 is shown. However, the parallel bit test may be conducted with any number of memory modules mounted on a socket and the same effects of the present embodiment may be obtained. The test system 400 of FIG. 4 differs from the test system 300 of FIG. 3A and test system 360 of FIG. 3B in that the test system 400 detects errors by comparing data output signals of the memory modules bit by bit.

The error signal generator 430 compares data output signal OUT_1 outputted from the first memory module 410 with data output signal OUT_2 outputted from the second memory module 420, which has bits corresponding to each bit of data output signal OUT_1 outputted from the first memory module 410. Since the same data is written into the first memory module 410 and the second memory module 420 the error signal generator 430 outputs an error signal ERROR based on detecting whether the data read out of the bits of each of the memory modules are in the same logic state. The error signal generator 430 receives the output signal OUT_1 of the first memory module 410 and the output signal OUT_2 of the second memory module 420 and outputs the result of an XOR operation as an error signal ERROR. The error signal generator 430 generates an error signal ERROR in the first logic state when the logic sates of the output signal OUT_1 of the first memory module 410 and the output signal OUT_2 of the second memory module 420 are different. The error signal generator 430 generates an error signal ERROR in the second logic state when the logic sates of the output signal OUT_1 of the first memory module 410 and the output signal OUT_2 of the second memory module 420 are the same. That is, when a memory module has defects, the error signal ERROR is in the first logic state. The error signal generator 430 may operate on the socket 230.

The error signal ERROR is transferred to the CPU 450 via input/output lines in the test system 400. In the present embodiment, the error signal ERROR may be transferred to the CPU 450 via the south bridge 440. The south bridge 440 is an integrated circuit located near peripheral component interconnect (PCI) slots of a computer main board. The south bridge 440 is well known in the art, and thus will not be described further herein. The CPU 450 determines whether to perform a basic input-output system (BIOS) routine call in response to the error signal ERROR. The BIOS (not shown) operates in response to the BIOS routine call of the CPU 450.

Although the test systems 300 of FIG. 3A and 360 of FIG. 3B control whether to block the DQS signal using the comparison signal COMP, the test systems 300 of FIG. 3A and 360 of FIG. 3B can also transfer the comparison signal COMP to the CPU 450 of the test system 400 of FIG. 4. In addition, although the test system 400 of FIG. 4 transfers the error signal ERROR to the CPU 450, the test system 400 can also control whether to block the DQS signal, as shown in FIG. 3A and FIG. 3B, using the error signal ERROR.

A test system conducting a parallel bit test according to the present invention, can be accurately detect defects in a memory module, and a possibility of an error in the detection can be reduced when a plurality of memory modules are tested as compared to conventional test systems.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A test system for conducting a parallel bit test on a plurality of memory modules mounted on a socket, the test system comprising:
a plurality of counters, each of the plurality of counters being associated with at least one memory unit in the plurality of memory modules, each of the plurality of counters being configured to generate a count signal based on a number of data bits having a reference logic state among data output signals output from the associated memory unit; and
a determining device configured to output a determination signal based on the count signals output from the plurality of counters, the determination signal indicating whether at least one of the memory modules have a defect.

2. The test system of claim 1, wherein each of the counters is configured so that a logic state of the output count signal is chosen based on whether the number of the data bits having the reference logic state is even or odd.

3. The test system of claim 1, further comprising:
a controller configured to selectively disable outputting the data output signals based on the determination signal.

4. The test system of claim 3, wherein the controller is connected to a DQS pad of the memory module and is configured to apply a disable voltage to the DQS pad based on the determination signal.

5. The test system of claim 4, wherein the determining unit is a comparator, and the determination signal is a comparison signal, the comparator being configured to generate the comparison signal having a first logic state if the count signals output by each of the plurality of counters have different logic states, and configured to generate the comparison signal having a second logic state if the count signals output by each of the plurality of counters have equal logic states.

6. The test system of claim 5, wherein the controller is configured to selectively apply the disable voltage to the DQS pad if the comparison signal is in the first logic state.

7. The test system of claim 6, wherein the controller is a transistor including a gate, a first terminal connected to the pad, and a second terminal, and the transistor is configured so that the comparison signal is applied to the gate, the DQS signal is applied to the first terminal, and the disable voltage is applied to the second terminal, the disable voltage being a ground voltage.

8. The test system of claim 1, wherein the determining device is an XOR gate configured to receive the count signals outputted from each of the counters, and perform an XOR operation, and the determination signal is an output of the XOR operation.

9. The test system of claim 1, further comprising:

a test signal generator configured to generate a test signal, the parallel bit test being conducted based on the test signal.

10. The test system of claim 9, wherein each of the plurality of counters is enabled or disabled in based on the test signal.

11. The test system of claim 1, wherein the test system is configured so that the parallel bit test is conducted if the memory modules each perform a refresh operation.

12. The test system of claim 11, further comprising:

an AND gate configured to conduct an AND operation on a refresh signal and the determination signal, the refresh signal being enabled if each of the plurality of memory modules conduct a refresh operation.

13. The test system of claim 1, wherein each of the plurality counters is configured to output the count signal via an unused pin of the memory module or the memory.

14. The test system of claim 1, wherein at least one of the plurality counters is associated with at least two memory units in the plurality of memory modules.

15. A test system for conducting a parallel bit test on a plurality of memory modules mounted on a socket, the test system comprising:

a first counter associated with at least one memory unit of a first memory module, the first counter being configured to generate a first count signal based on a number of data bits having a reference logic state among output data signals from the associated memory unit, the first counter being configured to output the first count signal in response to a test enable signal;

a second counter associated with at least one memory unit of a second memory module, the second counter being configured to generate a first count signal based on a number of data bits having a reference logic state among output data signals from the associated memory unit, the second counter being configured to output the second count signal in response to the test enable signal;

a determination device configured to output a determination signal based on the first and the second count signals; and a controller configured to selectively disable outputting the output data signals from the first and the second memory modules based on the determination signal.

* * * * *